US012160979B2

(12) United States Patent
Liu et al.

(10) Patent No.: US 12,160,979 B2
(45) Date of Patent: Dec. 3, 2024

(54) COMPRESSIBLE THERMAL LINK

(71) Applicant: Cisco Technology, Inc., San Jose, CA (US)

(72) Inventors: Chejung Liu, San Jose, CA (US); Ravinandana Mysore Ramachandra Rao, San Jose, CA (US); Vic Hong Chia, Sunnyvale, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 244 days.

(21) Appl. No.: 17/846,494

(22) Filed: Jun. 22, 2022

(65) Prior Publication Data
US 2023/0422449 A1    Dec. 28, 2023

(51) Int. Cl.
*H05K 7/20* (2006.01)
*G02B 6/42* (2006.01)

(52) U.S. Cl.
CPC ......... *H05K 7/2049* (2013.01); *G02B 6/4269* (2013.01); *H05K 7/20418* (2013.01); *H05K 7/20436* (2013.01)

(58) Field of Classification Search
CPC .......... H05K 7/20436; H05K 7/20445; H05K 7/2049; H05K 7/20409; H05K 7/20418; H05K 2201/10; H05K 2201/10007; H05K 2201/10121; H05K 7/2039–20518; H05K 7/20536; H04B 1/02; H04B 1/03; H04B 1/036; G02B 6/24; G02B 6/4201; G02B 6/4266; G02B 6/4268–4269; G02B 6/4269; G02B 6/0011; G02B 6/0081; G02B 6/0085; G02B 6/36; G02B 6/3807; G02B 6/381; G02B 6/3814
See application file for complete search history.

(56) References Cited

U.S. PATENT DOCUMENTS

| | | | | |
|---|---|---|---|---|
| 4,246,597 | A * | 1/1981 | Cole | ....................... H01L 23/40 257/713 |
| 9,518,785 | B2 * | 12/2016 | Szczesny | ............. G02B 6/4269 |
| 9,983,370 | B1 | 5/2018 | Mahoney | |
| 10,806,054 | B1 * | 10/2020 | Mahalingam | ........ H05K 7/2049 |
| 11,223,885 | B2 * | 1/2022 | Mays | ..................... G02B 6/4268 |
| 11,271,348 | B1 * | 3/2022 | Chen | ..................... H01R 12/724 |

(Continued)

FOREIGN PATENT DOCUMENTS

| | | |
|---|---|---|
| WO | 2020211930 A1 | 10/2020 |
| WO | 2021170203 A1 | 9/2021 |

OTHER PUBLICATIONS

"Graphite over Foam (GOF)," Laird, retrieved from the Internet Jun. 22, 2022, 4 pages; https://www.laird.com/products/multi-function-solutions-mfs-ise-integrated-solutions-engineered/hybrid-ise/graphite-over-foam-gof.

*Primary Examiner* — Zachary Pape
*Assistant Examiner* — Steven Ngo
(74) *Attorney, Agent, or Firm* — Edell, Shapiro & Finnan, LLC

(57) ABSTRACT

According to one embodiment, an apparatus is provided that includes a first block and a second block, one or more springs provided between the first block and the second block, and a thermally conductive wrap extending from the first block to the second block, wherein the thermally conductive wrap is configured to conduct heat away from the first block. An assembly including a chassis, a receptacle, and the apparatus is also provided, as well as a method for operating the apparatus.

20 Claims, 7 Drawing Sheets

(56) References Cited

U.S. PATENT DOCUMENTS

| | | | |
|---|---|---|---|
| 2006/0087816 A1* | 4/2006 | Ewes | F28F 3/048 |
| | | | 257/E23.088 |
| 2009/0229808 A1* | 9/2009 | Chu | H05K 7/2049 |
| | | | 165/185 |
| 2013/0000865 A1 | 1/2013 | Shi | |
| 2019/0146167 A1* | 5/2019 | Leigh | G02B 6/4261 |
| | | | 361/715 |
| 2019/0379417 A1 | 12/2019 | English et al. | |
| 2020/0301076 A1* | 9/2020 | Watts | H02J 13/0004 |
| 2022/0137311 A1* | 5/2022 | Ohlsson | H05K 7/20445 |
| | | | 385/134 |
| 2022/0294478 A1* | 9/2022 | Ohlsson | H05K 7/20336 |
| 2023/0050895 A1* | 2/2023 | Seitz | H05K 7/20409 |
| 2023/0258890 A1* | 8/2023 | Liu | H01R 43/18 |
| | | | 439/487 |

\* cited by examiner

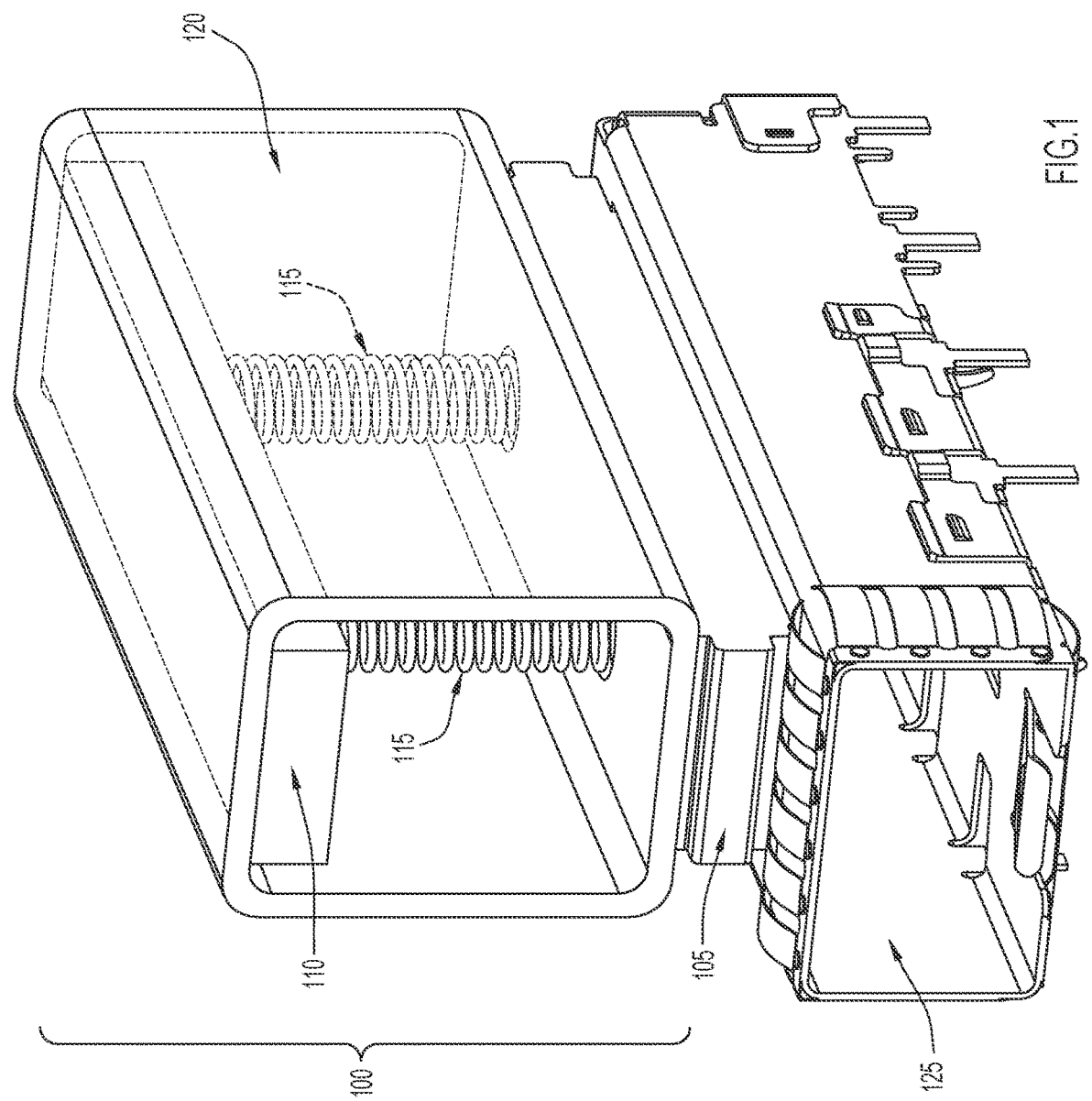

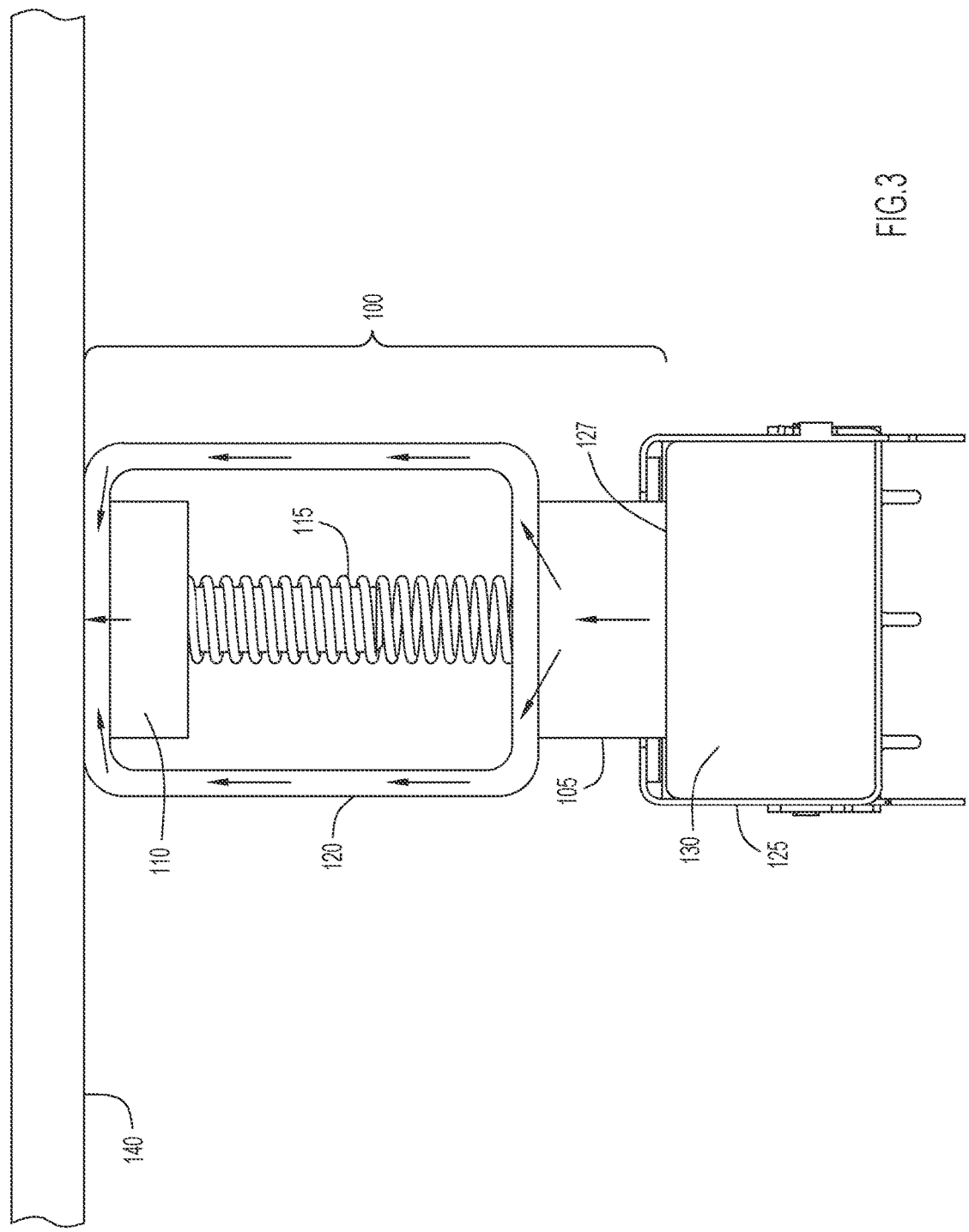

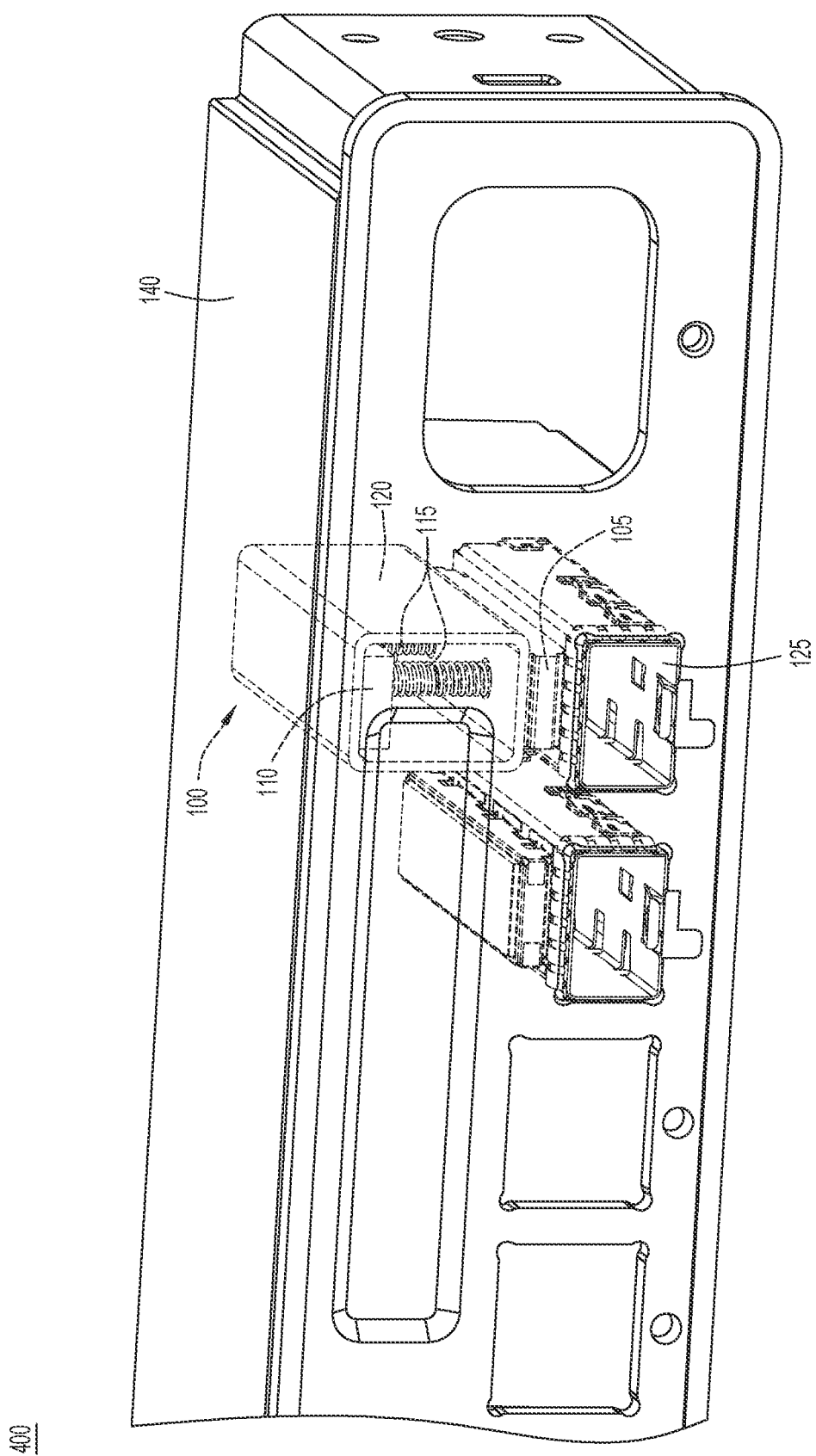

COMPRESSIBLE THERMAL LINK

TECHNICAL FIELD

The present disclosure relates to the cooling of electronic devices, and more specifically, to fanlessly cooling a device using a compressible thermal link.

BACKGROUND

The operation of electronic devices typically generates heat, which in excess can damage components or otherwise impact the functionality of a device. In order to avoid heat damage, a variety of solutions have been implemented. For example, using a fan to force air flow around a heat source can cool a device via convective heat transfer. Heat can also be conducted through a device to transfer the heat away from a heat source.

A fanless approach to cooling devices may be a desired design goal in order to reduce energy consumption, to avoid the potential for failure that is associated with moving parts, and to reduce costs. However, achieving a rate of heat transfer that is sufficient to properly cool a device can be difficult.

BRIEF DESCRIPTION OF THE DRAWINGS

FIG. 1 is a view in perspective of a compressible thermal link and a receptacle, in accordance with an example embodiment.

FIG. 3 is a sectional view depicting heat transfer from a receptacle, through a compressible thermal link, and into a chassis, in accordance with an example embodiment.

FIG. 4 is a view in perspective of a computing or networking device that includes a compressible thermal link and a receptacle, in accordance with an example embodiment.

DESCRIPTION OF EXAMPLE EMBODIMENTS

Overview

Figure 2A:
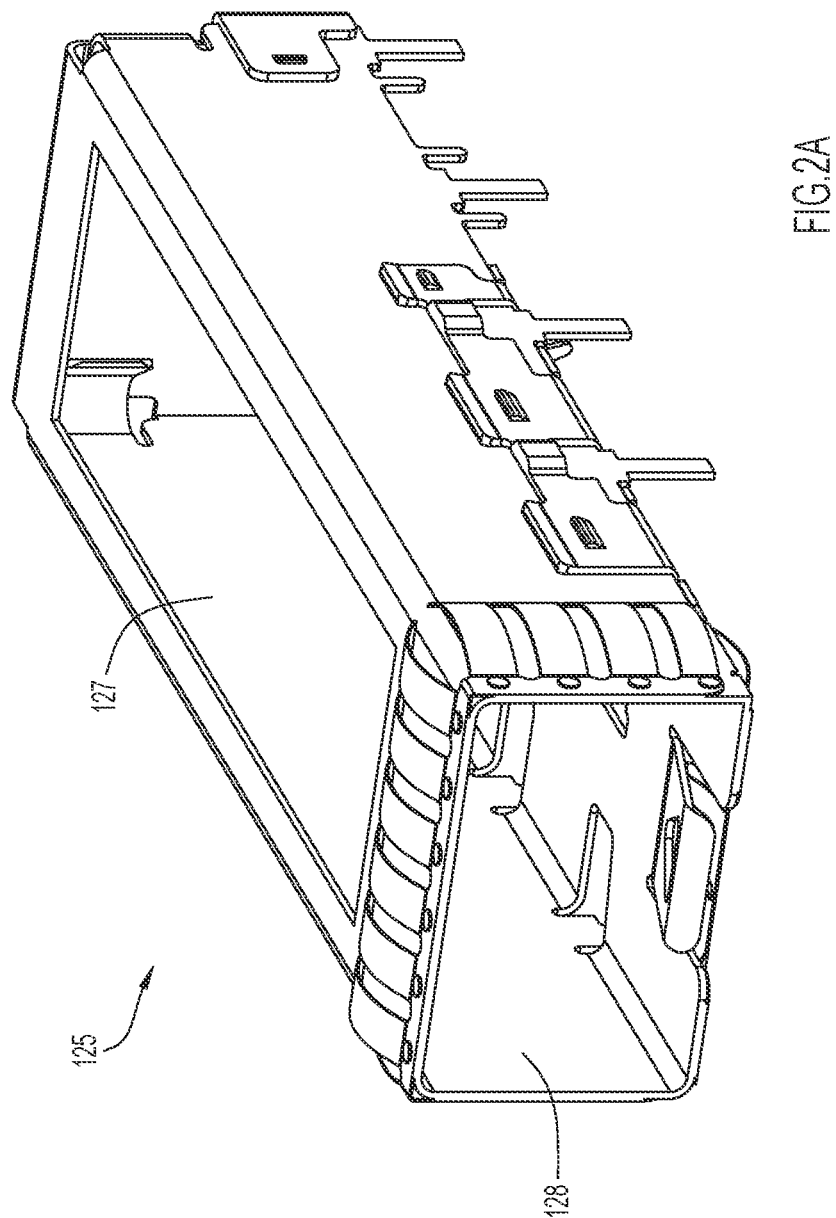
FIG. 2A is a view in perspective of a receptacle, in accordance with an example embodiment.

According to one embodiment, an apparatus is provided that includes a first block and a second block, one or more springs provided between the first block and the second block, and a thermally conductive wrap extending from the first block to the second block, wherein the thermally conductive wrap is configured to conduct heat away from the first block. An assembly including a chassis, a receptacle, and the apparatus is also provided, as well as a method for cooling an electronic device.

EXAMPLE EMBODIMENTS

Embodiments are provided for cooling electronic devices, and more specifically, to fanlessly cooling a device using a compressible thermal link.

Electronic devices, such as computing or networking devices, generate heat during their operation that can affect their functionality or reduce their lifespan. The two primary ways in which devices can be cooled include passive and active cooling. In active cooling solutions, energy is used to cool a device. Active cooling techniques can include forced air circulation (e.g., using fans), refrigeration techniques, and other forced circulation of cooling fluids. Passive cooling techniques, on the other hand, focus on designs that enable heat to be transferred away from heat sources without requiring energy to power the supporting mechanism. Passive cooling techniques often rely on conducting heat away from the heat source, which can be accomplished using heat sinks, heat pipes, vapor chambers, and the like.

Some devices, such as networking devices, include one or more receptacles into which a module (e.g., a communication cable's modular connector, an optical transceiver module, etc.) may be inserted. When the inserted module is itself a source of heat, it can be difficult to passively cool the device, as the insertion mechanism may involve moving parts and the passive cooling approach may rely on a certain shape in order to achieve thermal conduction. In particular, when a module is inserted, a portion of the device needs to compress or move to accommodate for the module. Conventional solutions can employ a thermal bridge, which may not be suitable for low-cost products. Another conventional technique is a gap pad, which uses a compressible and thermally conductive material to accommodate the insertion of the module; however, the compressible material typically fails to return to its original profile after a number of compression events, which means that a gap pad is not suitable for a receptacle that will have many modules inserted and removed over the course of the device's life.

Accordingly, the embodiments presented herein provide a thermal link that enables heat to be transferred away from a module that is plugged into a device. Passive cooling is accomplished by transferring the heat that is generated by a module into the chassis of the device. By transferring heat into the chassis of a device, the heat is directed away from more sensitive components, such as processors, memory, and the like. Moreover, embodiments presented herein can provide the benefit of solving a coplanarity issue that occurs when an inserted module is not aligned with the receptacle for the module, as the springs enable some twisting or rotation of the mated surfaces.

It should be noted that references throughout this specification to features, advantages, or similar language herein do not imply that all of the features and advantages that may be realized with the embodiments disclosed herein should be, or are in, any single embodiment. Rather, language referring to the features and advantages is understood to mean that a specific feature, advantage, or characteristic described in connection with an embodiment is included in at least one embodiment. Thus, discussion of the features, advantages, and similar language, throughout this specification may, but do not necessarily, refer to the same embodiment.

Furthermore, the described features, advantages, and characteristics may be combined in any suitable manner in one or more embodiments. One skilled in the relevant art will recognize that the embodiments may be practiced without one or more of the specific features or advantages of a particular embodiment. In other instances, additional features and advantages may be recognized in certain embodiments that may not be present in all embodiments.

These features and advantages will become more fully apparent from the following drawings, description and appended claims, or may be learned by the practice of embodiments as set forth hereinafter.

Embodiments are now described in detail with reference to the figures. FIG. 1 is a view in perspective of a compressible thermal link 100 and a receptacle 125, in accordance with an example embodiment.

In the embodiment depicted in FIG. 1, compressible thermal link 100 is an assembly that includes a pair of blocks 105 and 110, springs 115, and wrap 120. Compressible thermal link 100 may be positioned with respect to receptacle 125 such that heat can be transferred from a module when the module is inserted into receptacle 125. One or more components of compressible thermal link 100 may conduct heat, including block 105, block 110, and/or wrap 120. In some embodiments, springs 115 may be comprised of a conductive material.

Block 105 and/or block 110 may be comprised of a same or different thermally conductive material, such as aluminum, copper, and the like. The conductive material may include a metal foil. In some embodiments, block 105, block 110, or both may be a conventional vapor chamber or other vapor chamber (e.g., a chamber that includes a wick and a working fluid to redistribute heat). Each block 105 and 110 may have a same or different geometrical configuration, such as a rectangular prism, square prism, other prism, cylinder, irregular shape, or any other shape. In some embodiments, the shape of block 105 and/or block 110 may be selected based on the dimensions of receptacle 125.

One or more springs 115 may be provided between blocks 105 and 110 that enable blocks 105 and 110 to be moved toward each other when a module is inserted into receptacle 125. In particular, insertion of a module may cause block 105 to move away from receptacle 125 and toward block 110 in order to accommodate the module. Once a module is inserted into receptacle 125, springs 115 provide a bias that causes block 105 to apply pressure to the module. Springs 115 may be comprised of any suitable material, and springs 115 may have a spring constant that is selected such that block 105 exerts a desired force onto an inserted module. Springs 115 may be substantially helical springs or may conform to another shape. Springs 115 may be secured to blocks 105 and 110 using any attachment mechanism, including using an adhesive to attach springs 115 to blocks 105 and/or 110, embedding the ends of springs 115 into blocks 105 and/or 110, and/or using clips, staples, nails, screws, and the like to attach springs 115 to blocks 105 and/or 110. In some embodiments, springs may remain in place between the surfaces of blocks 105 and/or 110 that face each via friction between each spring and block. In some embodiments, one or more counterbores are provided into one or more of blocks 105 and/or 110 so that springs 115 may be retained into the counterbores to maintain the position of springs 115.

Wrap 120 may be comprised of a flexible conductive material that enables heat to be transferred from block 105 to block 110 and elsewhere. In some embodiments, wrap 120 may include a mesh that is composed of one or more thermally conductive materials. In some embodiments, wrap 120 is a graphite wrap that includes one or more layers of graphite sheet. For example, wrap 120 may include ten layers of graphite sheet. In various embodiments, the number of layers and/or the overall thickness of wrap 120 is selected based on a desired rate of heat transfer (e.g., more layers can have better cooling performance).

Receptacle 125 may include any receptacle for a module, such as a module that generates heat during operation. Receptacle 125 may be a receptacle for a transceiver, such as an optical or electrical transceiver that is used in communication networks. In some embodiments, the module may convert an optical signal to an electrical signal, or vice-versa. In one embodiment, receptacle 125 is a receptacle for a small form-factor pluggable (SFP) module. Receptacle 125 may have an attachment mechanism to enable a module to be removably inserted into receptacle 125; for example, receptacle 125 may include one or more gaps that mate with a corresponding one or more clips on of a module.

FIG. 2A is a view in perspective of a receptacle 125, in accordance with an example embodiment. As depicted, receptacle 125 includes a portal 127 and a receptacle opening 128. Portal 127 enables a heat-conducting element, such as block 105, to contact a module directly when the module is inserted in receptacle 125. Receptacle opening 128 provides a port through which a module may be inserted into, and removed from, receptacle 125. In various embodiments, the shape of portal 127 may be determined based on the structure of block 105, the structure of the type of module that is inserted into receptacle 125, and/or the nature of the heat generating component(s) of a module.

Figure 2B:
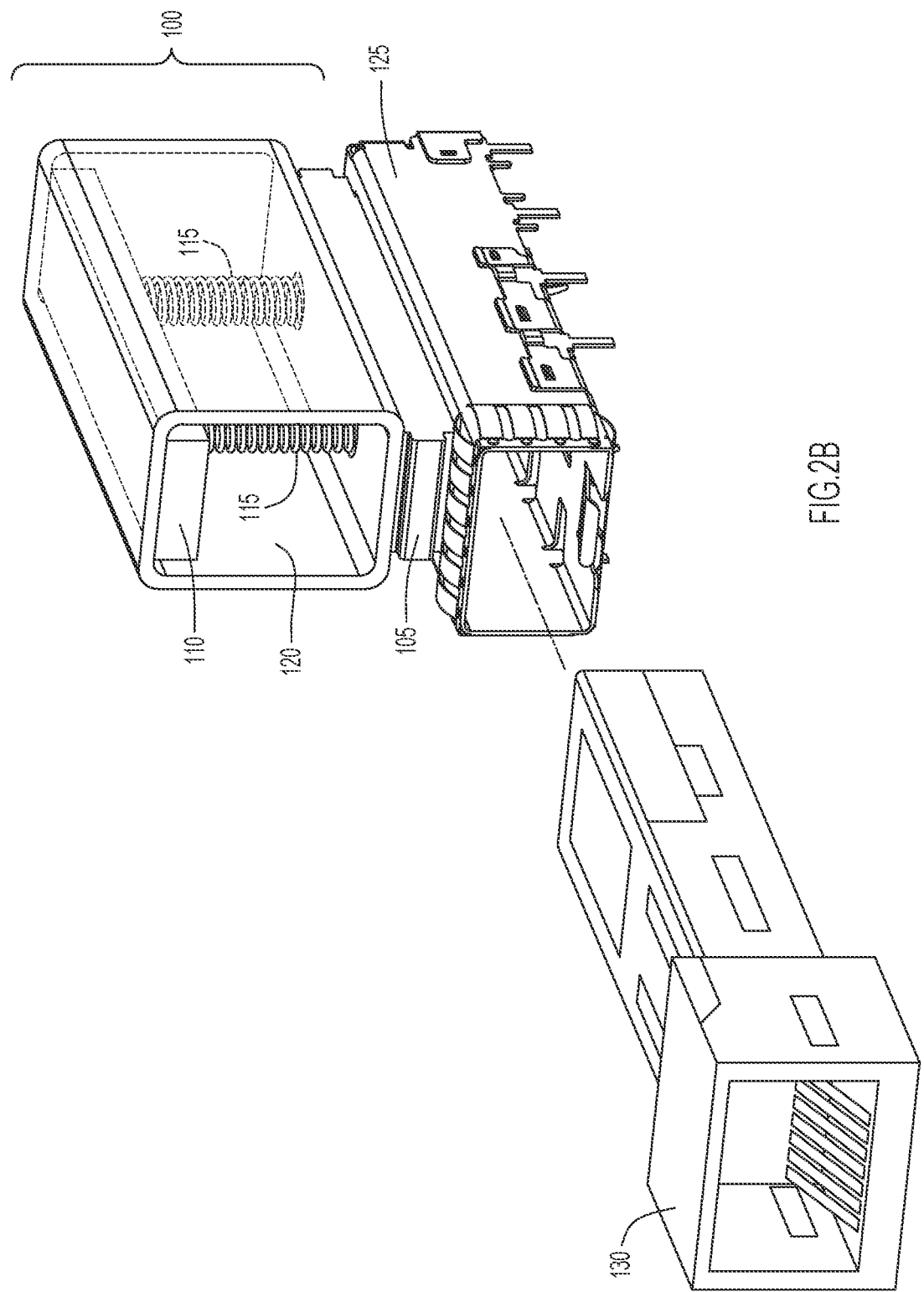
FIGS. 2B and 2C are views in perspective of a compressible thermal link, a receptacle, and a module, in accordance with an example embodiment.
Figure 2C:
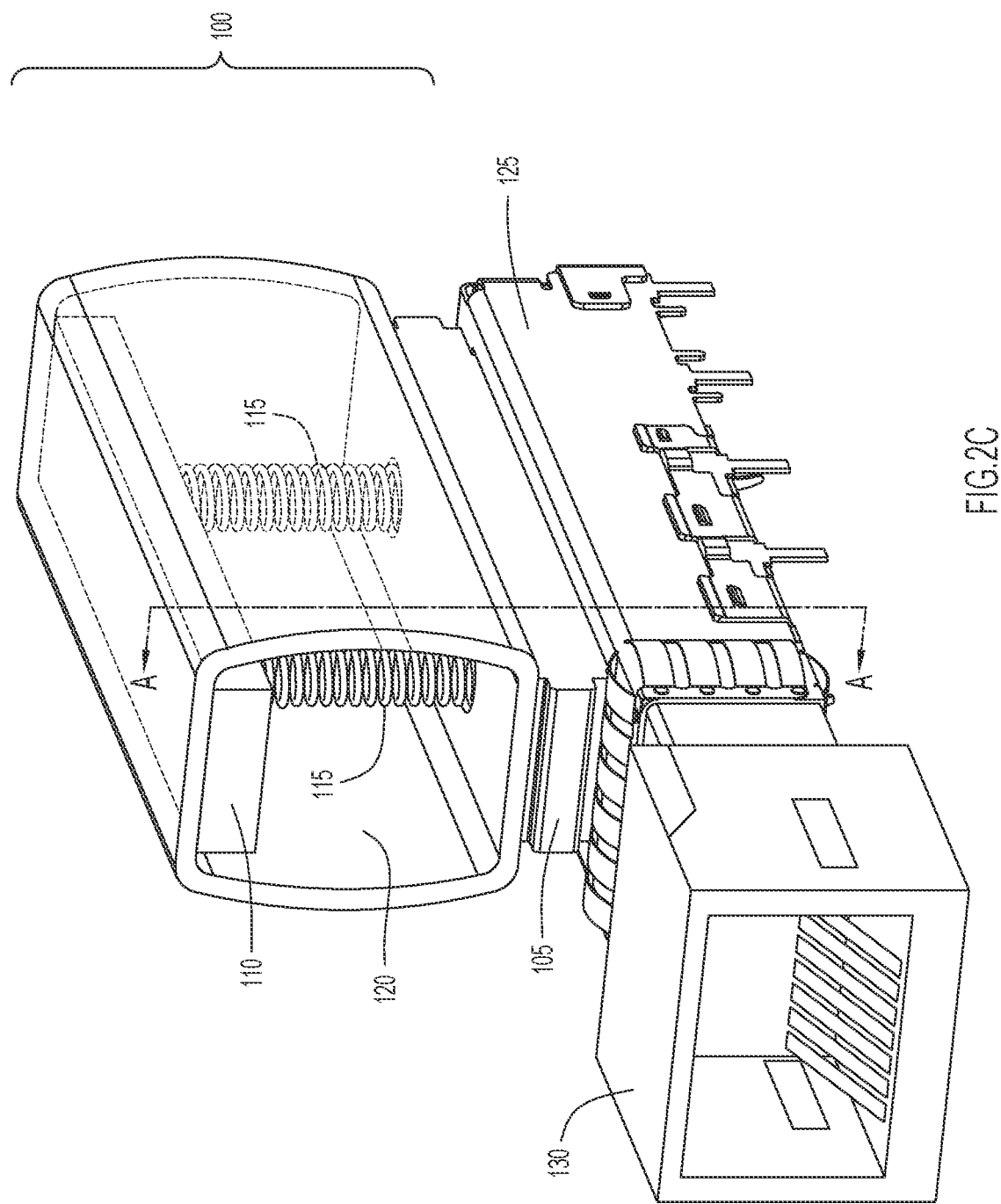

FIGS. 2B and 2C are views in perspective of a compressible thermal link, a receptacle, and a module, in accordance with an example embodiment. With reference to FIG. 2B, a compressible thermal link 100 and receptacle 125 are shown along with a module 130 that is configured to be inserted into receptacle 125. As depicted, compressible thermal link 100 is provided such that a portion of block 105 may extend into receptacle 125 (e.g., through portal 127, as depicted and described with reference to FIG. 2A). Also included in compressible thermal link 100 is block 110, wrap 120, and one or more springs 115.

Now with reference to FIG. 2C, module 130 is shown inserted into receptacle 125, and compressible thermal link 100 is provided such that heat may be transferred away from module 130. In particular, one or more springs 115 may bias block 105 against a surface of module 130; contact between block 105 and module 130 is facilitated by a portal (e.g., portal 127) provided in receptacle 125. Once in contact, heat produced by the module 130 may be transferred from block 105 to block 110, to wrap 120, and elsewhere.

FIG. 3 is a sectional view 300 depicting heat transfer from a module 130, through a compressible thermal link 100, and into a chassis 140, in accordance with an example embodiment. Sectional view 300 may depict a plane that corresponds to plane A-A that is depicted in FIG. 2C.

As depicted, module 130 is inserted into receptacle 125. Heat flow, represented by arrows, follows a gradient from a higher temperature, generated by one or more heat sources of module 130, to a lower temperature. In the depicted embodiment, heat initially flows from module 130 into block 105, as block 105 contacts module 130 due to the bias applied by one or more springs 115. The path of heat transfer then proceeds from block 105 to wrap 120 and accordingly to block 110. Heat is then transferred into chassis 140, whereupon the heat may conduct throughout a computing or networking device in a manner that substantially prevents or avoids the excess heating of thermally-sensitive components (e.g., processors, memory, etc.). accordingly, module 130 may be cooled passively (e.g., fanlessly) without damaging sensitive components.

FIG. 4 is a view in perspective of a computing or networking device 400 that includes a compressible thermal link 100 and a receptacle 125, in accordance with an example embodiment. Compressible thermal link 100 may be partially or fully enclosed by chassis 140, which can provide structural elements as desired for device 400. As depicted, heat may be transferred to chassis 140 from a module following a heat flow path in which heat flows into block 105, then to wrap 120 and block 110. Block 110 may be biased by springs 115 to cause wrap 120, which encloses block 110, to be pressed against chassis 140, thus thermally conducting heat from wrap 120 into chassis 140. It should be appreciated that device 400 may include a plurality of receptacles 125, some or all of which may be passively cooled according to the embodiments presented herein.

Figure 5:
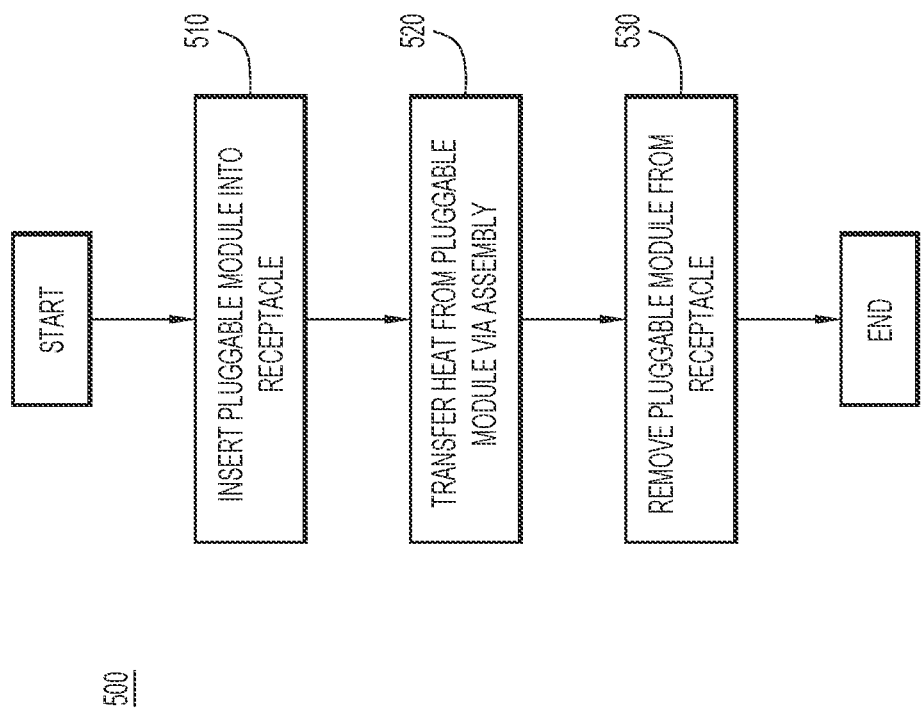
FIG. 5 is a flow chart depicting a method for operating a compressible thermal link, in accordance with an example embodiment.

FIG. 5 is a flow chart depicting a method 500 for operating a compressible thermal link, in accordance with an example embodiment.

A pluggable module is inserted into a receptacle at operation 510. The pluggable module may include a transceiver or other module that includes one or more sources of heat. In some embodiments, the module is an SFP module.

Heat may be transferred away from the pluggable module via an assembly at operation 520. Heat can be transferred during operation of a module. The assembly may correspond to a compressible thermal link that is depicted and described herein with reference to FIGS. 1-4. In particular, heat may be transferred away from the pluggable module via the path that is depicted and described with respect to FIG. 4.

The pluggable module may be removed from the receptacle at operation 530. While the pluggable module is inserted into receptacle, the blocks of the compressible thermal link (e.g., blocks 105 and 110) may be moved closer together as compared to when there is no pluggable module present. Accordingly, when a next pluggable module is inserted into the receptacle, the blocks of the compressible thermal link may be moved together (e.g., block 105 may be moved toward block 110) in order to accommodate the pluggable module.

Variations and Implementations

Embodiments described herein may include one or more networks, which can represent a series of points and/or network elements of interconnected communication paths for receiving and/or transmitting messages (e.g., packets of information) that propagate through the one or more networks. These network elements offer communicative interfaces that facilitate communications between the network elements. A network can include any number of hardware and/or software elements coupled to (and in communication with) each other through a communication medium. Such networks can include, but are not limited to, any local area network (LAN), virtual LAN (VLAN), wide area network (WAN) (e.g., the Internet), software defined WAN (SD-WAN), wireless local area (WLA) access network, wireless wide area (WWA) access network, metropolitan area network (MAN), Intranet, Extranet, virtual private network (VPN), Low Power Network (LPN), Low Power Wide Area Network (LPWAN), Machine to Machine (M2M) network, Internet of Things (IoT) network, Ethernet network/switching system, any other appropriate architecture and/or system that facilitates communications in a network environment, and/or any suitable combination thereof.

Networks through which communications propagate can use any suitable technologies for communications including wireless communications (e.g., 4G/5G/nG, IEEE 802.11 (e.g., Wi-Fi®/Wi-Fi6®), IEEE 802.16 (e.g., Worldwide Interoperability for Microwave Access (WiMAX)), Radio-Frequency Identification (RFID), Near Field Communication (NFC), Bluetooth™, mm.wave, Ultra-Wideband (UWB), etc.), and/or wired communications (e.g., T1 lines, T3 lines, digital subscriber lines (DSL), Ethernet, Fibre Channel, etc.). Generally, any suitable means of communications may be used such as electric, sound, light, infrared, and/or radio to facilitate communications through one or more networks in accordance with embodiments herein. Communications, interactions, operations, etc. as discussed for various embodiments described herein may be performed among entities that may directly or indirectly connected utilizing any algorithms, communication protocols, interfaces, etc. (proprietary and/or non-proprietary) that allow for the exchange of data and/or information.

Communications in a network environment can be referred to herein as 'messages', 'messaging', 'signaling', 'data', 'content', 'objects', 'requests', 'queries', 'responses', 'replies', etc. which may be inclusive of packets. As referred to herein and in the claims, the term 'packet' may be used in a generic sense to include packets, frames, segments, datagrams, and/or any other generic units that may be used to transmit communications in a network environment. Generally, a packet is a formatted unit of data that can contain control or routing information (e.g., source and destination address, source and destination port, etc.) and data, which is also sometimes referred to as a 'payload', 'data payload', and variations thereof. In some embodiments, control or routing information, management information, or the like can be included in packet fields, such as within header(s) and/or trailer(s) of packets. Internet Protocol (IP) addresses discussed herein and in the claims can include any IP version 4 (IPv4) and/or IP version 6 (IPv6) addresses.

To the extent that embodiments presented herein relate to the storage of data, the embodiments may employ any number of any conventional or other databases, data stores or storage structures (e.g., files, databases, data structures, data or other repositories, etc.) to store information.

Note that in this Specification, references to various features (e.g., elements, structures, nodes, modules, components, engines, logic, steps, operations, functions, characteristics, etc.) included in 'one embodiment', 'example embodiment', 'an embodiment', 'another embodiment', 'certain embodiments', 'some embodiments', 'various embodiments', 'other embodiments', 'alternative embodiment', and the like are intended to mean that any such features are included in one or more embodiments of the present disclosure, but may or may not necessarily be combined in the same embodiments. Note also that a module, engine, client, controller, function, logic or the like as used herein in this Specification, can be inclusive of an executable file comprising instructions that can be understood and processed on a server, computer, processor, machine, compute node, combinations thereof, or the like and may further include library modules loaded during execution, object files, system files, hardware logic, software logic, or any other executable modules.

It is also noted that the operations and steps described with reference to the preceding figures illustrate only some of the possible scenarios that may be executed by one or more entities discussed herein. Some of these operations may be deleted or removed where appropriate, or these steps may be modified or changed considerably without departing from the scope of the presented concepts. In addition, the timing and sequence of these operations may be altered considerably and still achieve the results taught in this disclosure. The preceding operational flows have been offered for purposes of example and discussion. Substantial flexibility is provided by the embodiments in that any suitable arrangements, chronologies, configurations, and timing mechanisms may be provided without departing from the teachings of the discussed concepts.

As used herein, unless expressly stated to the contrary, use of the phrase 'at least one of', 'one or more of', 'and/or', variations thereof, or the like are open-ended expressions that are both conjunctive and disjunctive in operation for any and all possible combination of the associated listed items. For example, each of the expressions 'at least one of X, Y and Z', 'at least one of X, Y or Z', 'one or more of X, Y and Z', 'one or more of X, Y or Z' and 'X, Y and/or Z' can mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z.

Additionally, unless expressly stated to the contrary, the terms 'first', 'second', 'third', etc., are intended to distinguish the particular nouns they modify (e.g., element, condition, node, module, activity, operation, etc.). Unless expressly stated to the contrary, the use of these terms is not intended to indicate any type of order, rank, importance, temporal sequence, or hierarchy of the modified noun. For example, 'first X' and 'second X' are intended to designate two 'X' elements that are not necessarily limited by any order, rank, importance, temporal sequence, or hierarchy of the two elements. Further as referred to herein, 'at least one of' and 'one or more of' can be represented using the '(s)' nomenclature (e.g., one or more element(s)).

Each example embodiment disclosed herein has been included to present one or more different features. However, all disclosed example embodiments are designed to work together as part of a single larger system or method. This disclosure explicitly envisions compound embodiments that combine multiple previously-discussed features in different example embodiments into a single system or method.

One or more advantages described herein are not meant to suggest that any one of the embodiments described herein necessarily provides all of the described advantages or that all the embodiments of the present disclosure necessarily provide any one of the described advantages. Numerous other changes, substitutions, variations, alterations, and/or modifications may be ascertained to one skilled in the art and it is intended that the present disclosure encompass all such changes, substitutions, variations, alterations, and/or modifications as falling within the scope of the appended claims.

In one form, an apparatus is provided comprising a first block and a second block, one or more springs provided between the first block and the second block, and a thermally conductive wrap extending from the first block to the second block, wherein the thermally conductive wrap is configured to conduct heat away from the first block.

In another form, the first block and the second block are comprised of a thermally conductive material.

In another form, the thermally conductive wrap extends from a first surface of the first block, and wherein the first surface faces the second block.

In another form, the thermally conductive wrap substantially surrounds a second surface of the second block, wherein the second surface faces away from the first block.

In another form, the first block is mounted and arranged to receive a transfer of heat energy from a heat generating component of an electronic device.

In another form, the one or more springs apply pressure to cause the first block to contact the heat generating component.

In another form, the heat generating component is a small form-factor pluggable transceiver module.

In another form, the thermally conductive wrap is comprised of a flexible material.

In another form, the thermally conductive wrap is selected from a group of: a graphite sheet, and a metal foil.

In another form, each of the one or more springs are secured to the first block by a counterbore.

In one form, an apparatus is provided, comprising a chassis, a receptacle for a module, and an assembly arranged between the plug and the chassis, the assembly comprising a first block and a second block, one or more springs provided between the first block and the second block, and a thermally conductive wrap extending from the first block to the second block, wherein the thermally conductive wrap is configured to conduct heat away from the first block.

In another form, the first block and the second block are comprised of a thermally conductive material.

In another form, the thermally conductive wrap extends from a first surface of the first block, and wherein the first surface faces the second block.

In another form, the thermally conductive wrap substantially surrounds a second surface of the second block, wherein the second surface faces away from the first block.

In another form, the first block receives a transfer of heat energy from a heat generating component inserted into the receptacle.

In another form, the one or more springs apply pressure to cause the first block to contact the heat generating component.

In another form, the heat generating component is a small form-factor pluggable transceiver module.

In another form, the thermally conductive wrap is comprised of a flexible material.

In one form, a method is provided comprising inserting a pluggable module into a receptacle, and transferring heat away from the pluggable module via an assembly that comprises a first block and a second block, one or more springs provided between the first block and the second block; and a thermally conductive wrap extending from the first block to the second block, wherein the first block contacts the pluggable module, wherein transferring comprises transferring heat away from the pluggable module to the first block, and transferring, by the thermally conductive wrap, heat away from the first block.

In another form, the one or more springs permit the first block to move toward the second block when the pluggable module is inserted into the pluggable module.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus comprising:
    a first block and a second block;
    one or more springs provided between the first block and the second block that bias the first block away from the second block; and
    a thermally conductive wrap extending from the first block to the second block, wherein the thermally conductive wrap is configured to conduct heat away from the first block, and wherein the thermally conductive wrap substantially surrounds a second surface of the second block, wherein the second surface faces away from the first block.

2. The apparatus of claim 1, wherein the first block and the second block are comprised of a thermally conductive material.

3. The apparatus of claim 1, wherein the thermally conductive wrap extends from a first surface of the first block, and wherein the first surface faces the second block.

4. The apparatus of claim 1, wherein the first block is mounted and arranged to receive a transfer of heat energy from a heat generating component of an electronic device.

5. The apparatus of claim 4, wherein the one or more springs apply pressure to cause the first block to contact the heat generating component.

6. The apparatus of claim 4, wherein the heat generating component is a small form-factor pluggable transceiver module.

7. The apparatus of claim 1, wherein the thermally conductive wrap is comprised of a flexible material.

8. The apparatus of claim 1, wherein the thermally conductive wrap is selected from a group of: a graphite sheet, and a metal foil.

9. The apparatus of claim 1, wherein each of the one or more springs are secured to the first block by a counterbore.

10. The apparatus of claim 1, wherein the thermally conductive wrap comprises a mesh.

11. An apparatus comprising:
a chassis;
a receptacle for a module; and
an assembly arranged between the receptacle and the chassis, the assembly comprising:
a first block and a second block;
one or more springs provided between the first block and the second block; and
a thermally conductive wrap extending from the first block to the second block, wherein the thermally conductive wrap is configured to conduct heat away from the first block, wherein the thermally conductive wrap substantially surrounds a second surface of the second block, and wherein the second surface faces away from the first block.

12. The apparatus of claim 11, wherein the first block and the second block are comprised of a thermally conductive material.

13. The apparatus of claim 11, wherein the thermally conductive wrap extends from a first surface of the first block, and wherein the first surface faces the second block.

14. The apparatus of claim 11, wherein the first block receives a transfer of heat energy from a heat generating component inserted into the receptacle.

15. The apparatus of claim 14, wherein the one or more springs apply pressure to cause the first block to contact the heat generating component.

16. The apparatus of claim 14, wherein the heat generating component is a small form-factor pluggable transceiver module.

17. The apparatus of claim 14, wherein the thermally conductive wrap is comprised of a flexible material.

18. The apparatus of claim 11, wherein the thermally conductive wrap comprises a mesh.

19. A method comprising:
inserting a pluggable module into a receptacle; and
transferring heat away from the pluggable module via an assembly that comprises a first block and a second block, one or more springs provided between the first block and the second block that bias the first block away from the second block; and a thermally conductive wrap extending from the first block to the second block, wherein the first block contacts the pluggable module, wherein transferring comprises transferring heat away from the pluggable module to the first block, and transferring, by the thermally conductive wrap, heat away from the first block, wherein the thermally conductive wrap substantially surrounds a second surface of the second block, wherein the second surface faces away from the first block.

20. The method of claim 19, wherein the one or more springs permit the first block to move toward the second block when the pluggable module is inserted into the receptacle.

* * * * *